US007288974B2

(12) United States Patent
Ozawa

(10) Patent No.: US 7,288,974 B2
(45) Date of Patent: Oct. 30, 2007

(54) WAVE CORRECTION CLOCK AND METHOD

(75) Inventor: Kenji Ozawa, Chiba (JP)

(73) Assignee: Seiko Precision Inc., Chiba (JP)

( * ) Notice: Subject to any disclaimer, the term of this patent is extended or adjusted under 35 U.S.C. 154(b) by 158 days.

(21) Appl. No.: 10/938,120

(22) Filed: Sep. 10, 2004

(65) Prior Publication Data

US 2005/0094496 A1 May 5, 2005

(30) Foreign Application Priority Data

Sep. 10, 2003 (JP) ............................ 2003-318703

(51) Int. Cl.
*H03L 7/06* (2006.01)

(52) U.S. Cl. ...................................... 327/156; 327/147

(58) Field of Classification Search ................ 327/156, 327/158, 175, 147, 149, 161
See application file for complete search history.

(56) References Cited

U.S. PATENT DOCUMENTS 5,777,520 A * 7/1998 Kawakami .................. 331/1 R
6,891,416 B2 * 5/2005 Miyamoto .................. 327/161
2006/0033542 A1 * 2/2006 Lin et al. .................... 327/156

FOREIGN PATENT DOCUMENTS

| | | | |
|---|---|---|---|
| DE | 4414581 | A1 | 2/1995 |
| JP | 10-082873 | A1 | 3/1998 |
| JP | 2002-286876 | | 3/2002 |

* cited by examiner

*Primary Examiner*—Quan Tra
(74) *Attorney, Agent, or Firm*—Townsend and Townsend and Crew LLP

(57) ABSTRACT

A wave correction clock of the present invention receives a wave signal including time information based on information defined by a pulse width of a rectangular pulse output at a predetermined period, and a period measuring section measures a signal period TRn of the rectangular pulse. A time difference measuring section obtains a time difference between the signal period TRn and an internal reference period TB where the signal period TRn is within a predetermined range, and a time difference determining section corrects generation timing of a reference pulse at the internal reference period TB from an average value of time differences obtained when the rectangular pulse where the signal period TRn is within a predetermined range is detected multiple times.

6 Claims, 5 Drawing Sheets

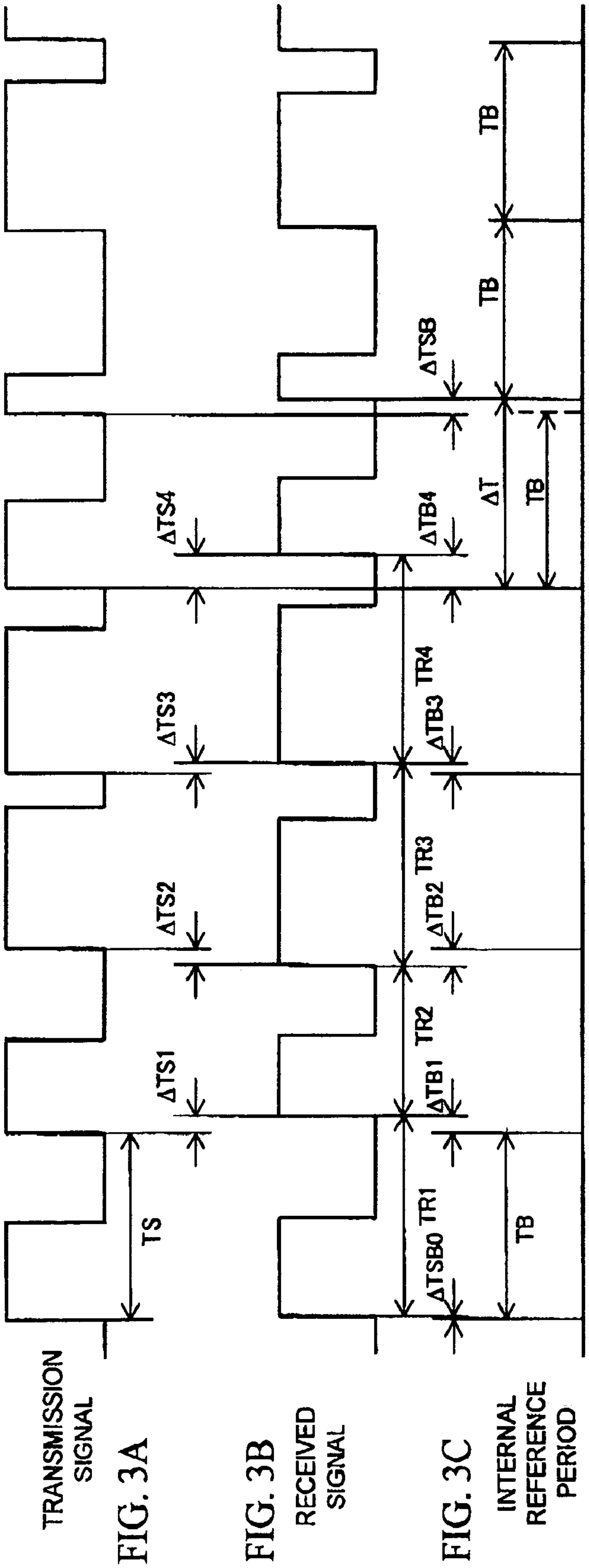
FIG. 3A TRANSMISSION SIGNAL
FIG. 3B RECEIVED SIGNAL
FIG. 3C INTERNAL REFERENCE PERIOD

TRANSMISSION SIGNAL

FIG. 4B RECEIVED SIGNAL

FIG. 4C DETECTION PERIOD

WAVE CORRECTION CLOCK AND METHOD

CROSS-REFERENCES TO RELATED APPLICATIONS

This application claims priority to Japanese Patent Application No. 2003-318703 filed on Sep. 10, 2003.

BACKGROUND OF THE INVENTION

The present invention relates to a wave correction clock and method for receiving a standard frequency and time signal (standard radio wave signal) to detect time information and correct counting or keeping time thereof.

DESCRIPTION OF THE RELATED ART

A long wave standard frequency and time signal wave (standard radio wave signal) including a time code are transmitted in the United States. Regarding this signal, one frame is set per one minute, and time data such as year (lower two digits of the dominical year), the total number of days (the total number of days accumulated since January 1), leap second, hour, and minute is transmitted in series in the form of a binary code. More specifically, one bit is represented by a rectangular pulse of 1 Hz, and "1" and "0" are expressed by setting pulse widths to 500 ms and 200 ms, respectively. Furthermore, a frame reference "Pr", which identifies the start of data of one frame, and pulses widths of position markers P0 to P5, which identify the start of each data group, are set to 800 ms. A long wave radio signal of 60 KHz is used as a carrier wave.

In order to obtain time information from such a long wave standard frequency and time signal wave, start timing of each second frame (time frame), which has one second time interval used as a reference in measuring a pulse continuous time (pulse width) of a first rectangular pulse, is synchronized or substantially synchronized with the rising edge of the rectangular pulse, that is, the front end of the rectangular pulse. Then, the second frame is determined with reference to this start timing, and the pulse continuous time (high level continuous time; pulse width) of the rectangular pulse in each second frame is measured to obtain timing every minute on the minute when the markers P are continuous.

There is generally used a method in which the pulse continuous time (pulse width) of the rectangular pulse in each second frame is measured to obtain bit data of "0", "1" and "P", and the obtained bit data is decoded to obtain time information.

Moreover, as disclosed in Unexamined Japanese Patent Application KOKAI Publication No. 2002-286876, there is a method in which timing obtained by correcting the timing of the rising edge (or falling edge) of the rectangular pulse is used as start timing of the internal second frame.

However, in the environment that receives such the long wave standard frequency and time signal wave, the detection timing of the edge of the rectangular pulse included in the long wave standard frequency and time signal wave is sometimes shifted by the influence of the so-called city noise and noise generated by household electric appliances.

In order to reduce the influence of the shift of the rectangular detection timing, in the above-described document, there is used a method in which when it is detected whether or not the pulse width of the rectangular pulse is within a predetermined range for one second and the rectangular pulse within the predetermined range is continuously detected multiple times, a difference between the period of each rectangular pulse and one second is obtained, the rectangular pulse detection timing is corrected from the rise or fall of the finally detected rectangular pulse by using the average of the obtained differences, and the corrected rectangular pulse detection timing is used as start timing of the internal second frame.

However, according to this method, since the finally detected rise or fall timing of the rectangular pulse becomes a final criterion as shown in FIGS. 4A to 4C, even if correction is made by the average value of the time difference detected previously, the start timing of the second frame is largely influenced by the final rectangular pulse.

BRIEF SUMMARY OF THE INVENTION

The present invention has been made with consideration given to the above problem in the conventional art, and an object of the present invention is to provide a wave correction clock and method that are capable of preventing detection accuracy of time information from being decreased even if fluctuation is generated in a received signal.

Another object of the present invention is to provide a wave correction clock and method that are capable of accurately correcting counting or keeping time thereof.

In order to achieve the above objects, the present invention is a (radio) wave correction clock that counts time, receives a wave signal, having time information defined by a pulse width of a rectangular pulse having a predetermined basic period by a receiving section, and detects time information from the pulse width of each rectangular pulse to correct the counted time thereof, includes an internal reference period generating section that generates a reference pulse at an internal reference period that is same as the basic period of the rectangular pulse. The wave correction clock further includes a period measuring section that measures a signal period of the rectangular pulse received by the receiving section. The wave correction clock further includes a time difference measuring section that obtains a phase difference of the reference pulse with respect to the rectangular pulse. The wave correction clock further includes a correcting section that corrects, when a rectangular pulse which satisfies a predetermined condition is detected, generation timing of the reference pulse such that the generation timing is synchronous with the rectangular pulse.

The correcting section obtains, when a plurality of adjacent rectangular pulses whose measured signal period is within a predetermined range are detected, an average value of phase differences of the reference pulse with respect to the plurality of adjacent rectangular pulses which phase differences are obtained by the time difference measuring section, and corrects generation timing of the reference pulse by the average value.

The internal reference period generating section starts generation of the reference pulse at the internal reference period using the rise of the rectangular pulse received and detected by the receiving section as generation timing, and corrects generation timing of the reference pulse by the average value of the phase differences obtained by the correcting section.

Actually, the wave correction clock further includes a pulse width detecting section that detects a pulse width of the rectangular pulse with reference to the reference pulse after generation timing is corrected by the correcting section.

When the rectangular pulse where the measured signal period is within a predetermined range is continuously detected multiple times, an average value of phase differences of the reference pulse with respect to the rectangular pulses detected continuously is obtained and generation timing of the reference pulse is corrected based on the average value, so that an error between the rise of the rectangular pulse and generation timing of the reference pulse becomes small regardless of the rise timing of the finally detected rectangular pulse, making it possible to obtain a correct start timing of the second frame with respect to the transmission signal of the long wave standard frequency and time signal wave.

Moreover, even in the circumstances where the reference period and the period of the transmission signal of the long wave standard frequency and time signal wave come close to each other and the signal with a delay phase and the signal with a lead phase are mixed, it is possible to obtain the correct start timing of the second frame.

BRIEF DESCRIPTION OF THE DRAWINGS

These objects and other objects and advantages of the present invention will become more apparent upon reading of the following detailed description and the accompanying drawings in which:

FIGS. 3A to 3C are views illustrating timing charts representing time correction processing of the wave correction clock of FIG. 1;

FIGS. 4A to 4C are views illustrating timing charts representing time correction processing of a conventional wave correction clock.

DETAILED DESCRIPTION OF THE INVENTION

A wave correction clock to which the present invention is applied is specifically explained with reference to the drawings.

Figure 1:
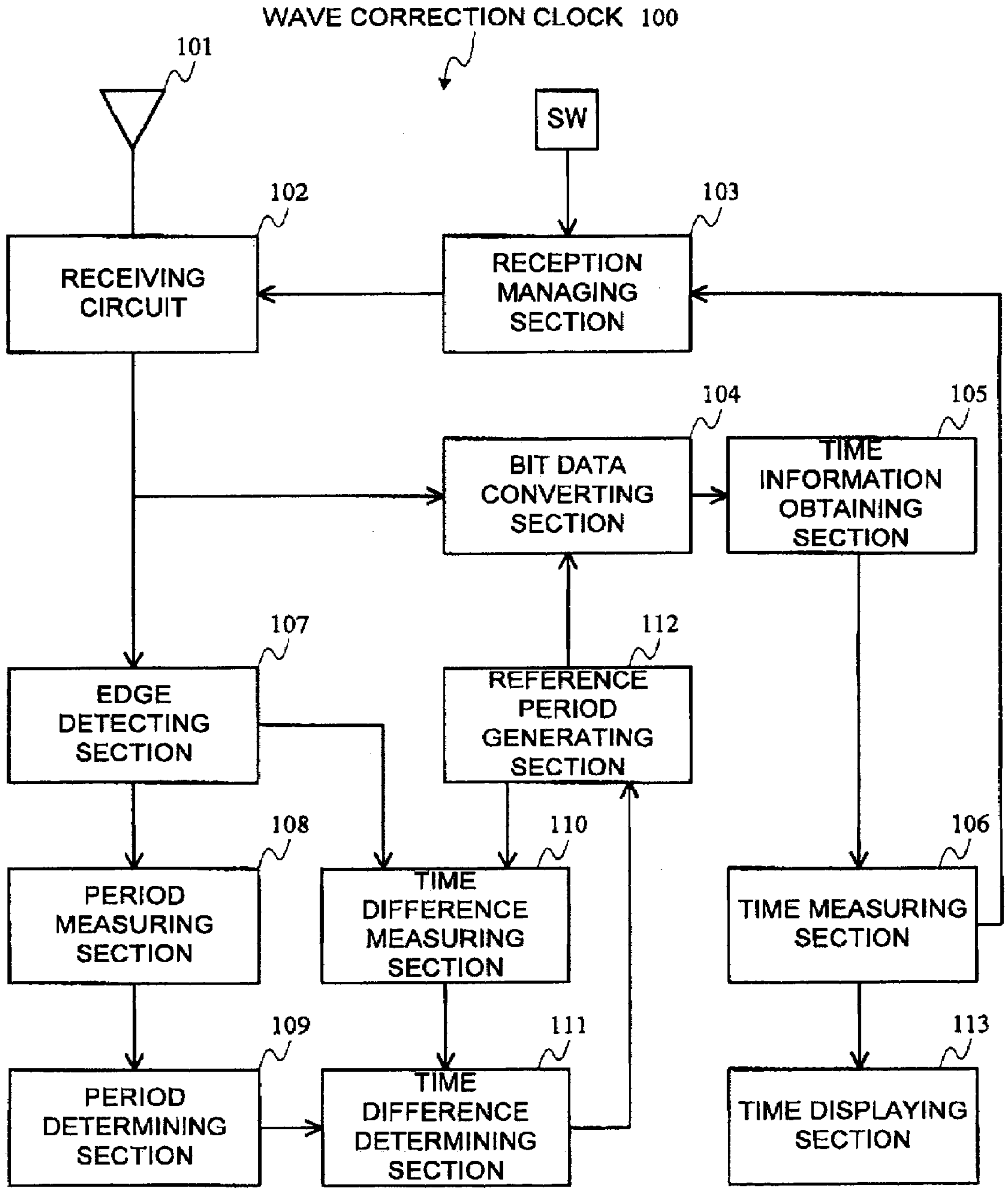
FIG. 1 is a block diagram illustrating main configuration parts of a wave correction clock according to an embodiment of the present invention.

FIG. 1 is a block diagram illustrating main configuration parts of a wave correction clock 100 to which the present invention is applied.

A reception managing section 103 detects that the current time becomes a preset reception start time or that a correction switch SW is depressed (turned ON) to control reception, detection, correction and end of a long wave standard frequency and time signal wave. The long wave standard frequency and time signal wave are received by an antenna 101. After amplifying the long wave standard frequency and time signal wave received by the antennas 101, a receiving circuit 102 detects (demodulates) a time signal where one minute is set as one frame and one bit is set as a rectangular pulse of 1 Hz.

A bit data converting section 104 detects a pulse width of a rectangular pulse of 1 Hz detected by the receiving circuit 102 based on a reference pulse output in each reference period by a reference period generating section 112 based on a reference period output by a reference period generating section 112 to convert the rectangular pulse to a time code having markers "1" and "0".

After detecting the start of one frame from a frame reference "Pr" in the time code converted by the bit data converting section 104, a time information obtaining section 105 detects a binary code. The time information obtaining section 105 executes conversion to time information such as hour and minute of a binary code based on a format of a time code defined by the long wave standard frequency and time signal wave, determination whether time information is correct or not, and time correction of time kept by a time measuring section 106.

A time measuring section 106 measures time based on the reference pulse output by the reference period generating section 112, represents the measured time by second, minute, hour, day, month, year, day of the week, and displays them on a time display section 113.

An edge detecting section 107 detects a rising edge of the rectangular pulse signal generated by the receiving circuit 102 and outputs a pulse width defined by adjacent rising edges to a period measuring section 108 and a time difference measuring section 110.

The period measuring section 108 measures a period of the rising edge of the rectangular pulse signal detected by the edge detecting section 107.

A period determining section 109 stores multiple edge periods measured by the period measuring section 108 in the order of measurement, obtains an average value of a time difference between each of "n" number of most lately measured periods and the reference period (=an ideal value of a measured period), and corrects generation timing of the reference pulse of the reference period generating section 112 based on the average value.

The time difference measuring section 110 measures a phase difference (time difference) of the reference pulse generated by the reference period generating section 112 with respect to a rise of the rectangular pulse signal.

Figure 5:
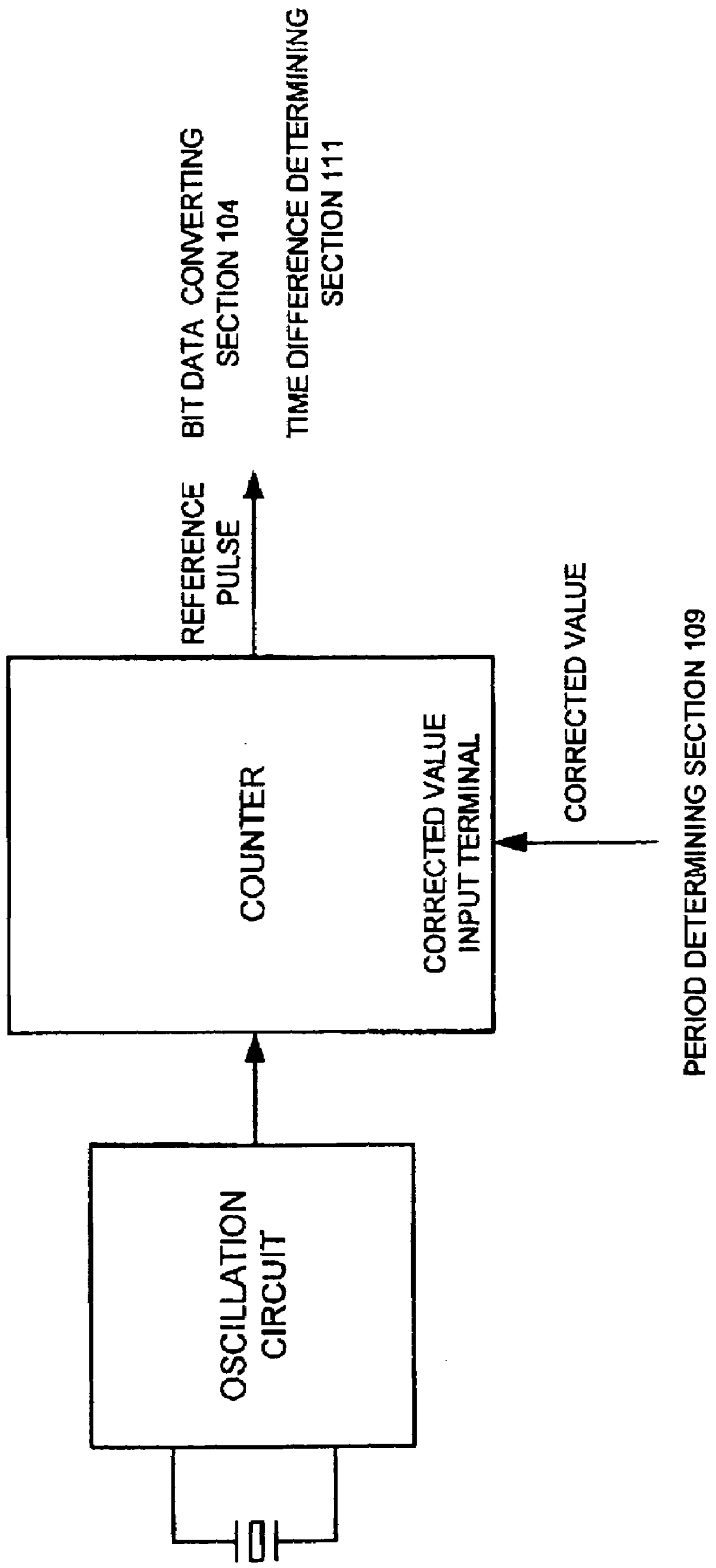
FIG. 5 is a block diagram showing configuration of a reference period generating section of the wave correction clock shown in FIG. 1.

In addition, as shown in FIG. 5, the reference period generating section 112 comprises an oscillation circuit including a crystal oscillator, and a counter circuit which counts signals from the oscillation circuit.

The counter circuit counts the number of pulses included in an oscillation signal supplied form the oscillation circuit. When the counted value reaches the sum of a preset value which is set in advance and an externally supplied correction value, the reference period generating section 112 generates the reference value. Specifically, the reference period generating section 112 starts generation of the reference pulse in each reference period using the rising edge of the rectangular pulse signal detected by the edge detecting section 107 as reference pulse generation timing.

The correction value is not supplied in a normal case, and the reference period generating section 112 thus outputs the reference pulse in a period corresponding to the preset value. This period is the above-described reference period. When the correction value (corresponding to a later-described time difference correction value TBR) is supplied from the period determining section 109 to adjust generation timing of the reference pulse, the reference period generating section 112 generates the reference pulse earlier or later than a normal generation timing by a time corresponding to the supplied correction time.

The reference period generating section 112 outputs the reference pulse to the time difference determining section 111 and the bit data converting section 104 in each reference period. The period of the reference period is the same that of the bit pulse of 1 Hz with 60 bits for 60 seconds per one period transmitted by the long wave standard frequency and time signal wave.

The time difference determining section 111 measures a time difference between the edge period detected by the edge detecting section 107 and the reference period.

The following shows the list of codes used in the explanation of the present embodiment.

n; A pulse number, which is a positive integer, and is used at the time of sum and detection of the continuous pulses.

TS; A predetermined time corresponding to a pulse period of a transmission signal transmitted by a transmitting station of a long wave standard frequency and time signal wave.

TRn; An edge period (pulse period) of a received signal obtained by receiving and detecting a long wave standard frequency and time signal wave.

ΔTSn; A time difference between a predetermined time TS and an edge period TRn.

TB; An internal reference period.

ΔTSB0; A delay time before a reference pulse is output using an edge of a received signal, which is obtained by receiving and detecting a long wave standard frequency and time signal wave, as a trigger.

TBn; A time difference between an internal reference period TB and an edge period TRn.

TDR; A correction value that corrects output timing of an internal reference period TB obtained by a time difference TBn between an internal reference period TB and an edge period TRn.

ΔT; A corrected internal reference period obtained by correcting an internal reference period TB by a correction value TDR for correcting a generation timing of a reference pulse.

ΔTSB; A time difference (correction error) of an internal reference period TB corrected by a predetermined time TS and a correction value TDR.

ΣTBn; A sum of n time differences TBn.

Additionally, the predetermined time TS, the internal reference period TB and the delay time ΔTSB0 are constants, and the edge period TRn and the time difference TBn are measured values.

Figure 2:
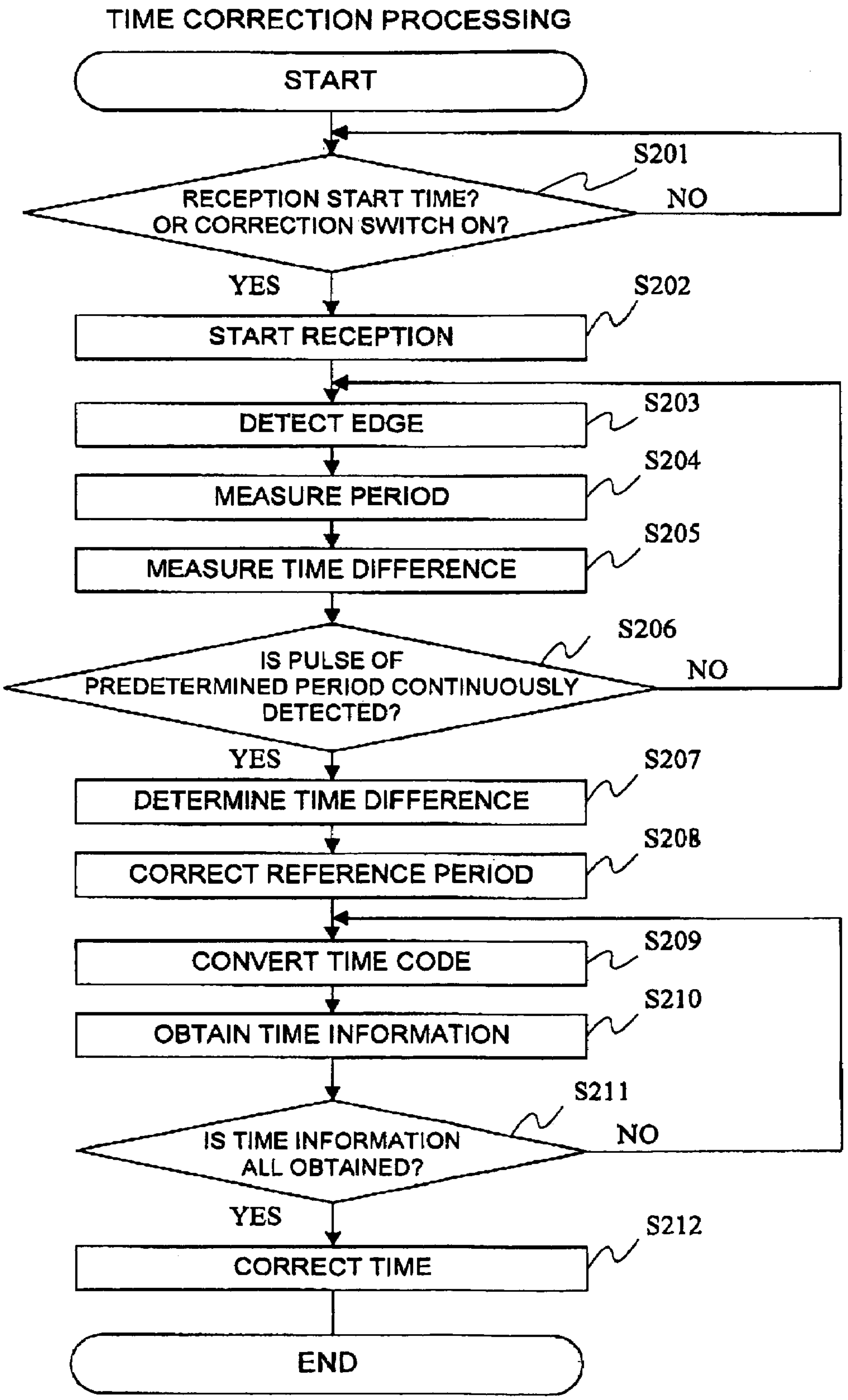
FIG. 2 is a view illustrating a main operation of the wave correction clock of FIG. 1 by a flowchart.
Figure 4A:
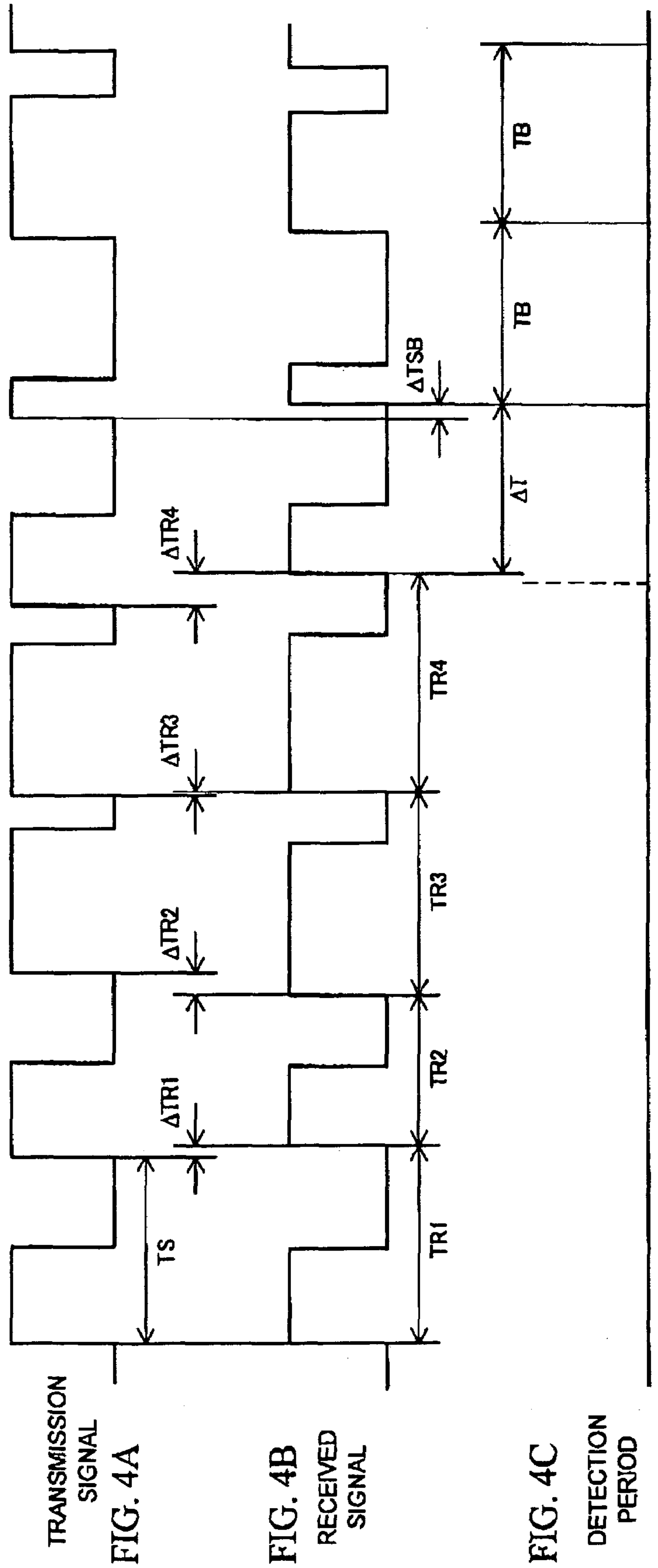

An explanation is next given of time correction processing of a wave correction clock to which the present invention is applied with reference to a flowchart shown in FIG. 2. The time correction processing is processing that operates under management by mainly the reception managing section 103 in a state that a battery (not shown) is installed. Moreover, the time measuring section 106 and the time displaying section 113 always operate in a state that the battery is installed.

The reception managing section 103 detects whether time reaches a stored received time based on the time measured by the time measuring section 106 or whether the correction switch SW is depressed (S201). Here, the received time is a preset time. For example, this may be one or multiple time, such as 2 a.m. and 5 a.m. that are preset per one day, or this may be time that is preset every predetermined time, for example, time that is preset every three hours, with reference to twelve o'clock midnight.

When detecting whether time reaches the received time and whether the correction switch SW is depressed, the reception managing section 103 provides an instruction of a reception start of the long wave standard frequency and time signal wave to the receiving circuit 102 (S202). The receiving circuit 102, which has received the instruction of the reception start of the long wave standard frequency and time signal wave, detects a rectangular pulse of 1 KHz from the long wave standard frequency and time signal wave received by the antenna 101, and outputs the result to the edge detecting section 107.

A rising edge of the rectangular pulse detected by the receiving circuit 102 is detected by the edge detecting section 107, and the edge period of the rising edge is output by the period measuring section 108 and the time difference measuring section 110 (S203).

The reference period generating section 112 generates a reference pulse at the time, using as reference pulse generation timing, when the edge detecting section 107 detects the rising edge. Additionally, the reference pulse generation timing is slightly delayed by delay (ΔTSB0) from the rising edge detection time due to delay in electronic circuit as illustrated in the timing chart of FIG. 3C.

The period measuring section 108 measures an edge period TRn (S204) from the rising edge detected by the edge detecting circuit 107. The time difference measuring section 110 measures a time difference (phase difference) ΔTBn between the rising edge and the reference pulse generated in each reference period TB by the reference period generating section 112 (S205). The respective measurement results, namely, the edge period TRn and the time difference ΔTBn are sequentially stored in a memory of the period determining section 109 and a memory of the time difference determining section 111, respectively.

After that, the period determining section 109 stores the edge period TRn and determines whether multiple (four) edge periods TRn, which are within a constant error range ±α, are continuous for a predetermined time TS of the transmission signal transmitted by the transmitting station of the long wave standard frequency and time signal wave. For example, assume that the predetermined time TS is one second (1000 ms) and the error range α is ±62.5 ms. The period determining section 109 determines whether or not four pulse rising edges have been detected continuously at time intervals of 1000 ms±62.5 ms therebetween. This is because measured data of rectangular pulses having received a small noise influence should only be used. In a case where the period determining section 109 determines that this condition is satisfied, the period determining section 109 outputs a time difference determination request to the time difference determining section 111 (S206).

When the time difference determination request is input to the time difference determining section 111, the time difference determining section 111 executes a time difference determination of a time difference ΔTBn measured based on a pulse synchronous with the nth edge period TRn used in determination by the period determining section 109 (S207).

Here, ΔTBn=TB−TRn is established.

In the time difference determining step (S207), the time difference ΔTBn between the pulse rising edge and the reference pulse is measured. For example, in the case where the rectangular pulse is a delay phase with respect to the reference pulse (in the case of the rectangular pulses at edge periods TR1, TR3, TR4 in FIG. 3B), the time difference ΔTBn becomes a large value close to TS. While, in the case where the rectangular pulse is a lead phase with respect to the reference pulse (in the case of the rectangular pulse at edge period TR2 in FIG. 3B), the time difference ΔTBn becomes a small value. According to this embodiment, the above cases are used depending on the following cases 1 and 2 to determine the time difference.

In the time difference determining step, determination whether the time difference ΔTBn satisfies condition 1 ($0 \leqq \Delta TBn \leqq 2\alpha$), and determination whether the time difference ΔTBn satisfies condition 2 ($TS-2\alpha\Delta TBn<TS$), are executed, and the number of establishment of both conditions is counted as CL and CU, respectively.

As a result of counting, when all time differences ΔTBn satisfy at least either one of conditions 1 and 2 and CL ≠0 and CU ≠0, the time difference determining section 111 determines that the edge of the received signal is detected in almost the same period as the reference period TB, and obtains a time difference correction value TDR=CL×TS. This correction means that received signals of the delay phase and lead phase are mixed with respect to the reference period TB. In such a case, since a correction value of the reference period TB cannot be obtained from an average value of simple time difference TRn, the correction value TDR is obtained.

In addition, when CL ≠0 and CU ≠0 are not established, the time difference correction value TDR is 0. In other words, this shows the case of all delay phases or all lead phases with respect to the reference period TB. Moreover, coefficients α of the conditions 1 and 2 are the same as the error range (±62. 5 ms) of the previously explained predetermined time TS.

When n time differences ΔTBn subsequent to the time difference correction value TDR are obtained by the time difference determining section 111, the period determining section 109 obtains correction time TBR=(ΣTBn+TDR)/n with respect to the reference period TB from the time difference correction time TDR and n time differences ΔTBn. The period determining section 109 supplies a correction value corresponding to the time difference correction value TBR to the counter circuit of the reference period generating section 112 via the time difference determining section 111 in order to correct reference pulse generation timing of the reference period generating section 112 at period ΔT=TB+TBR where the reference period TB is corrected by the time difference correction value TBR (S208). Namely, as shown in FIG. 3C, the reference period generating section 112 once chops the period of the corrected period ΔT based on the correction value supplied to the counter circuit and thereafter restarts generation of the reference pulse at the reference period TB, which is the original period, based on the preset value of the counter circuit, to output the reference pulse to the bit data converting section 104.

In this way, according to the present embodiment, since the average value in the time difference between the rising edges of four rectangular pulses and the reference pulse is obtained to correct generation timing of the reference pulse, even if the rising timing of the fourth rectangular pulse is largely shifted from the generation timing of the reference pulse, it is possible to output the reference pulse having a smaller error as a whole with the rising period of the rectangular pulse received.

The bit data converting section 104 measures the reference period TB of the reference pulse generated by the reference period generating section 112, namely, a pulse width of the rectangular pulse with reference to time between the reference pulse generation time and the falling edge of the rectangular pulse. The bit data converting section 104 performs conversion to a time code in which the rectangular pulses, which have pulse widths near 500 ms and 200 ms respectively, are binary codes of "1" and "0" of binary numbers and the rectangular pulse, which has a pulse width near 800 ms, is a position marker (S209).

The time information obtaining section 105 analyzes the time code converted by the bit data converting section 104 to detect two continuous position markers, which is the beginning of one frame, and performs conversion from the binary code during this process to time information such as hours and minutes based on a format of time code information defined by the long wave standard frequency and time signal wave. The time information obtaining section 105 executes determination whether converted time information is established as a bit pattern, determination whether the relevant information is established as time information, for example, determination whether the relevant information is BCD (Binary Coded Decimal) of 00 to 59 in the case of a minute (S10), and repeats obtaining time information until correctly determined time information, namely, time data transmitted by the long wave standard frequency and time signal wave is all prepared (S211; No, S209).

When time information determined as being normal is all prepared, the time information obtaining section 105 performs correction of measured time to the time measuring section 106, and outputs a time information obtaining completion notification to the reception managing section 103 (S212).

When receiving the time information obtaining completion notification from the time information obtaining section 105, the reception managing section 103 stops the receiving operation of the receiving circuit 102 to complete time correction processing by the long wave standard frequency and time signal wave. Additionally, in this embodiment, the reception managing section 103 has a function of determining that the long wave standard frequency and time signal wave cannot be received to cause time correction processing to forcefully end when no time information obtaining completion notification is received from the time information obtaining section 105 even if a fixed period of time, for example, 20 minutes pass.

In the embodiment of the present invention, though the number of times the edge period TRn within the predetermined range is continuously detected is 4, the number of times is not limited to this number and 3 or 5 times may be possible. Though the error range is ±62.5 ms, an allowable error range may be more than or less than this value.

In the above-described embodiment, configuration of each section of the wave correction clock has not been explained in detail. Any configuration is applicable as long as the above-described functions can be realized. For example, each element in such configuration may be constituted by a plurality of circuits or a single circuit. Or, a plurality of elements may be constituted as a processor such as DSP (Digital Signal Processor).

The "clock" in the present specification is not limited to the so-called "clock" having a time measuring function and a time indicating function. The "radio wave correction clock" in the present specification widely includes a wristwatch, a bracket clock, a time recorder, a timestamp, a computer, a POS (Point Of Sales) terminal, etc. which have a function for receiving a standard time and frequency signal and correcting the kept time, and apparatuses(for example, a monitor apparatus used for various meters such as a gas meter, a power meter, etc.) and devices (including an IC (Integration Chip) and an IC tag) which have a time measuring function but no time indicating function.

A case where the standard time and frequency signal is a long wave standard time and frequency signal has been mainly explained. However, the frequency and the modulation method of the standard time and frequency signal, and the kind of the transmitting station of the standard time and frequency signal are arbitrary. For example, the frequency may be a high frequency (a short wave standard time and frequency signal may be received). The present invention can be applied to an apparatus which receives a time signal from a GPS (Global Positioning System) and corrects its kept time based on this time signal.

In the present embodiment, it has been explained that to use only measured data of rectangular pulses having received a small influence by noises, etc., phase difference (time difference) of the reference pulse with respect to the rectangular pulse is measured when rectangular pulses within a predetermined error range are continuously detected multiple times. However, the present invention is not limited to this embodiment but any method is applicable as long as it is for measuring phase difference of the reference pulse with respect to a rectangular pulse having received a small influence by noises, etc. and correcting the generation timing of the reference pulse based on the measured phase difference. Further, in the above-described embodiment, a simple arithmetic average is used as the average. However, other static values may be used as long as they are a value indicating multiple phase differences averagely.

The present invention can be used to a wave correction clock.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No.2003-318703 filed on Sep. 10, 2003 and including specification, claims, drawings and summary. The disclosure of the above Japanese Patent Application is incorporated herein by reference in its entirety.

What is claimed is:

1. A wave correction clock that counts time, receives a wave signal, having time information defined by a pulse width of a rectangular pulse having a predetermined basic period by a receiving section and detects time information from the pulse width of each rectangular pulse to correct the counted time thereof based on the detected time information, comprising:

an internal reference period generating section that generates a reference pulse at an internal reference period that is same as the basic period of the rectangular pulse;

a period measuring section that measures a signal period of the rectangular pulse received by said receiving section;

a time difference measuring section that obtains a phase difference of the reference pulse with respect to the rectangular pulse; and a correcting section that corrects, when a rectangular pulse which satisfies a predetermined condition is detected, generation timing of the reference pulse such that the generation timing is synchronous with the rectangular pulse, based on the phase difference obtained by the time difference measuring section, wherein the correcting section obtains, when a plurality of adjacent rectangular pulses whose measured signal periods are within a predetermined range are detected, correction time based on an average value of the phase differences obtained by the time difference measuring section, and corrects generation timing of the reference pulse based on the correction time.

2. A wave correction clock that counts time, receives a wave signal, having time information defined by a pulse width of a rectangular pulse having a predetermined basic period by a receiving section and detects time information from the pulse width of each rectangular pulse to correct the counted time thereof based on the detected time information, comprising:

an internal reference period generating section that generates a reference pulse at an internal reference period that is same as the basic period of the rectangular pulse;

a period measuring section that measures a signal period of the rectangular pulse received by said receiving section;

a time difference measuring section that obtains a phase difference of the reference pulse with respect to the rectangular pulse; and a correcting section that corrects, when a rectangular pulse which satisfies a predetermined condition is detected, generation timing of the reference pulse such that the generation timing is synchronous with the rectangular pulse, wherein the correcting section obtains, when a plurality of adjacent rectangular pulses whose measured signal period is within a predetermined range are detected, an average value of phase differences of the reference pulse with respect to the plurality of adjacent rectangular pulses which phase differences are obtained by the time difference measuring section, and corrects generation timing of the reference pulse by the average value.

3. The wave correction clock according to claim 2, wherein the internal reference period generating section starts generation of the reference pulse at the internal reference period using the rise of the rectangular pulse received and detected by the receiving section as generation timing, and corrects generation timing of the reference pulse by the average value of the phase differences obtained by the correcting section.

4. The wave correction clock according to claim 2, further comprising a pulse width detecting section that detects a pulse width of the rectangular pulse with reference to the reference pulse after generation timing is corrected by the correcting section.

5. A time correction method for a wave correction clock which measures time, receives a wave signal, having time information based on information defined by a pulse width of a rectangular pulse output at a predetermined basic period to detect time information from the pulse width of each rectangular pulse and to correct the measured time, said method comprising the steps of:

generating a reference pulse at an internal reference period that is the same as the basic period of the rectangular pulse;

measuring a signal period of the received rectangular pulse;

obtaining a phase difference of the reference pulse with respect to the rectangular pulse; and obtaining, when a plurality of adjacent rectangular pulses whose measured signal period is within a predetermined range are detected, an average value of phase differences of the reference pulse with respect to the plurality of adjacent rectangular pulses, and correcting generation timing of the reference pulse based on the average value.

6. A program for controlling a computer to execute the steps according to claim 5, and for correcting time measured by a radio wave clock which receives a wave signal, having time information defined by a pulse width of a rectangular pulse having a predetermined basic period and detects time information from a pulse width of each rectangular pulse.

* * * * *